United States Patent [19]
Shore

[11] Patent Number: 6,104,650
[45] Date of Patent: Aug. 15, 2000

[54] SACRIFICE READ TEST MODE

[75] Inventor: Michael Shore, Boise, Id.

[73] Assignee: Micron Technology, Inc., Boise, Id.

[21] Appl. No.: 09/350,602

[22] Filed: Jul. 9, 1999

[51] Int. Cl.[7] .................................................. G11C 13/00
[52] U.S. Cl. ...................... 365/201; 365/189.11; 365/203
[58] Field of Search .............................. 365/189.11, 201, 365/203

[56] References Cited

U.S. PATENT DOCUMENTS

| | | | |
|---|---|---|---|
| 5,487,037 | 1/1996 | Lee | 365/189.1 |
| 5,544,108 | 8/1996 | Thomann | 365/201 |
| 5,651,011 | 7/1997 | Keeth | 371/22.1 |
| 5,684,809 | 11/1997 | Stave et al. | 371/27 |

Primary Examiner—Terrell W. Fears
Attorney, Agent, or Firm—Schwegman, Lundberg, Woessner & Kluth, P.A.

[57] ABSTRACT

Testing methods and facilitating circuitry to permit activation and latching of multiple word lines in a dynamic memory device in conjunction with external control over digit line equilibrate and activation of sense amplifiers. Such testing methods are adaptable for use prior to row repair or post row repair. Such testing methods permit controlled stressing of cell margin and beta ratio by selective coupling of one or more sacrificial rows to a digit line prior to sensing of data in a target row. Useful design and reliability information may be obtained through application of various embodiments of such testing methods.

68 Claims, 9 Drawing Sheets

SACRIFICE READ TEST MODE

TECHNICAL FIELD

The present invention relates generally to testing of memory devices and in particular to testing methods and facilitating circuitry to permit activation and latching of multiple word lines in a dynamic memory device in conjunction with external control over digit line equilibrate and activation of sense amplifiers.

BACKGROUND

Many electronic systems include a memory device, such as a Dynamic Random Access Memory (DRAM), to store data. A typical DRAM includes an array of memory cells. Each memory cell includes a storage capacitor that stores the data in the cell and an access transistor that controls access to the data. The charge stored across the capacitor is representative of a data bit and is usually either a high voltage, logic 1, or a low voltage, logic 0.

Data can be either stored in the memory cells during a write mode, or data may be retrieved from the memory cells during a read mode. The data is transmitted on signal lines, referred to as digit lines, which are coupled to input/output (I/O) lines through transistors used as switching devices. Typically, for each bit of data stored, its true logic state is available on an I/O line and its complementary logic state is available on an I/O complement line. However, each such memory cell is coupled to, or associated with, only one digit line of the digit line pair through an access transistor.

Typically, the memory cells are arranged in an array and each cell has an address identifying its location in the array. The array includes a configuration of intersecting conductive lines, and memory cells are associated with the intersections of the lines. In order to read from or write to a cell, the particular cell in question must be selected, or addressed. The address for the selected cell is represented by input signals to a word line or row decoder and to a digit line or column decoder. The row decoder activates a word line in response to the word line address. The selected word line activates the access transistors for each of the memory cells in communication with the selected word line. The column decoder selects a digit line pair in response to the digit line address. For a read operation, the selected word line activates the access transistors for a given word line address, the charge of the selected memory cells are shared with their associated digit lines, and data is sensed and latched to the digit line pairs.

Memory arrays are often divided into subarrays having a number of rows of memory cells. The rows may be grouped into local phases, facilitating access to a specific group of rows in the subarray. Local phases from multiple subarrays may further be grouped into global phases, facilitating access to a specific group of local phases in the array. Global phase drivers enable the groupings of local phases. Local phase drivers, in turn, enable the groupings of rows in the subarrays. Word line drivers enable individual rows. In normal operation, only one local phase may be enabled in each subarray, and back-to-back activate row commands are not permissible within a single subarray.

Memory devices having memory arrays are usually tested to verify reliability. A variety of testing procedures are utilized and usually include tests that stress the memory device beyond its design parameters. It is expected that a device passing a stress test will operate correctly under normal use conditions. Memory devices often have logic and circuitry to facilitate testing, and such logic and circuitry are generally responsive to one or more external signals to signify that a test mode should be entered and a test performed.

The ability to sense the data stored in the storage capacitor is a critical operation of the memory device. A memory device operating near the capabilities of the sensing operation may fail in use. Accordingly, there is a need in the art for testing procedures capable of stressing the sensing operation of memory devices, and logic and circuitry to facilitate such testing.

SUMMARY

The invention provides methods for testing dynamic memory devices, and memory devices adapted to perform such methods, as well as various apparatus incorporating such memory devices. One embodiment of the invention provides a method of testing a dynamic memory device. The method includes coupling at least one first sacrificial memory cell to a first digit line of the memory device with digit line equilibrate activated and sense amplifiers deactivated, deactivating digit line equilibrate, coupling a target memory cell to the first digit line subsequent to deactivating digit line equilibrate, and activating the sense amplifiers subsequent to coupling the target memory cell to the first digit line and while the at least one first sacrificial memory cell remains coupled to the first digit line.

Another embodiment of the invention provides a method of testing a dynamic memory device. The method includes coupling at least one first sacrificial memory cell to a first digit line of a digit line pair of the memory device with digit line equilibrate activated and sense amplifiers deactivated, coupling at least one second sacrificial memory cell to a second digit line of the digit line pair of the memory device with digit line equilibrate activated and sense amplifiers deactivated, deactivating digit line equilibrate, coupling a target memory cell to the first digit line subsequent to deactivating digit line equilibrate, and activating the sense amplifiers subsequent to coupling the target memory cell to the first digit line and while the at least one first sacrificial memory cell remains coupled to the first digit line and further while the at least one second sacrificial memory cell remains coupled to the second digit line.

A further embodiment of the invention provides a method of testing a dynamic memory device. The method includes latching a sacrificial row address, firing a word line associated with the sacrificial row address with digit line equilibrate activated and sense amplifiers deactivated, deactivating digit line equilibrate without decoupling the sacrificial memory cell from the digit line, latching a target row address, firing a word line associated with the target row address with digit line equilibrate deactivated, and activating the sense amplifiers with the target memory cell and the sacrificial memory cell coupled to the digit line.

A still further embodiment of the invention provides a method of testing a dynamic memory device. The method includes latching a first sacrificial row address, firing a word line associated with the first sacrificial row address with digit line equilibrate activated and sense amplifiers deactivated, latching a second sacrificial row address, firing a word line associated with the second sacrificial row address with digit line equilibrate activated and sense amplifiers deactivated, deactivating digit line equilibrate without decoupling the first or second sacrificial memory cells from the digit line, latching a target row address, firing a word line associated with the target row address with digit line equilibrate deactivated, and activating the sense amplifiers with the target memory cell and the first and second sacrificial memory cells coupled to the digit line.

Another embodiment of the invention provides a dynamic memory device. The memory device includes an array of memory cells, a sense amplifier strobe override circuit in communication with the array of memory cells, and a row address latch override circuit in communication with the array of memory cells. The sense amplifier strobe override circuit and the row address latch override circuit permit activation and latching of multiple word lines in a dynamic memory device in conjunction with external control over digit line equilibrate and activation of sense amplifiers. Various embodiments of the invention provide for dynamic memory devices adapted to carry out methods of the invention. Other embodiments include apparatus of varying scope incorporating dynamic memory devices adapted to carry out methods of the invention.

DESCRIPTION OF THE EMBODIMENTS

In the following detailed description of the preferred embodiments, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that process or mechanical changes may be made without departing from the scope of the present invention. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor, as well as other semiconductor support structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined only by the appended claims.

Figure 1:
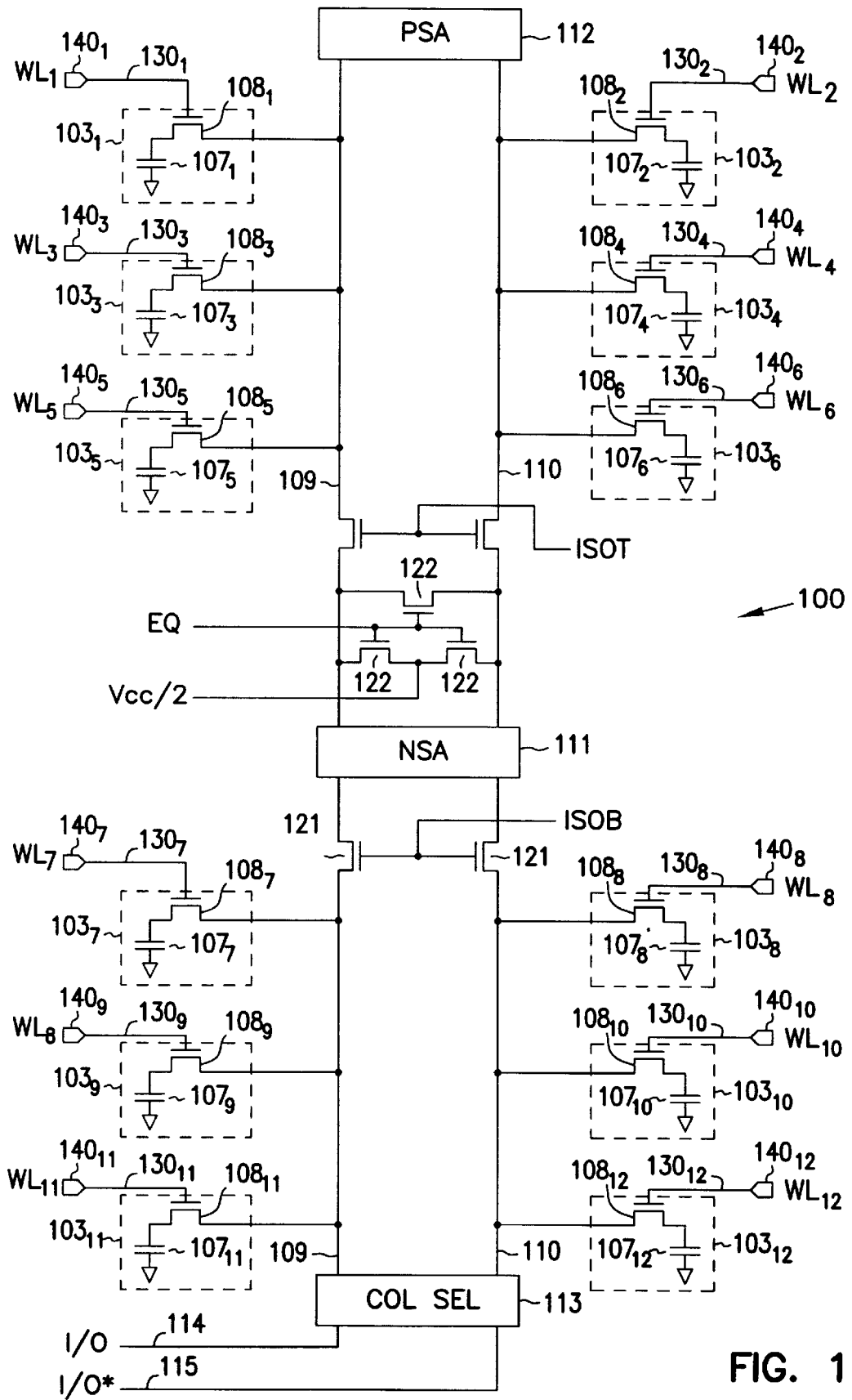
FIG. 1 is a portion of a dynamic memory device adapted in accordance with the invention.

FIG. 1 depicts a portion of a dynamic memory device 100 which stores digital information or data in an arrangement of memory cells 103. Memory device 100 is adapted in accordance with the invention. Memory cells 103 are representative of a portion of memory cells of an array or subarray. Each memory cell 103 comprises a storage capacitor 107 capable of holding a charge and an access transistor 108 for accessing the capacitor charge.

The charge is a voltage potential referred to as a data bit and is typified as having either a high voltage, logic 1, or a low voltage, logic 0. The data bit is amplified and latched to the digit 109 and digit complement 110 lines by the N-sense amplifier 111 and P-sense amplifier 112. The digit line 109 and the digit complement line 110 form a digit line pair. The P-sense amplifier 112 pulls one digit line of the digit line pair to a high potential, usually the supply potential, $V_{CC}$, while the N-sense amplifier 111 pulls the remaining digit line to a ground potential.

In a normal read operation of memory device 100, digit line 109 and digit complement line 110 are first equilibrated through equilibrate transistors 122. As control signal RAS* is brought low, equilibrate transistors 122 are transitioned off, and a memory cell is coupled to one digit line of the digit line pair by activating the access transistor. As an example, assume a read operation of the data stored in memory cell $103_1$. In the example case, storage capacitor $107_1$ is coupled to digit line 109 through access transistor $108_1$. The charge stored in storage capacitor $107_1$ is shared with digit line 109 such that the potential of digit line 109 is pulled up if the data bit stored in storage capacitor $107_1$ is a logic 1, or pulled down if the data bit stored in storage capacitor $107_1$ is a logic 0.

The sense amplifiers then sense the differential, or cell margin, across the digit line pair. Typically, due to relative sensitivities of NMOS transistors of N-sense amplifiers (not shown), N-sense amplifier 111 is fired or activated first to sense the differential and pull the digit line with the lower potential to ground. The P-sense amplifier 112 is then fired to pull up the remaining digit line of the digit line pair, typically to $V_{CC}$. To increase the signal-to-noise ratio and thus improve the reliability of the sensing operation, one half of the digit line pair is often isolated from the N-sense amplifier 111 during the sensing operation. Increasing the signal-to-noise ratio results from the increase in beta ratio, which is the ratio of the capacitance of the memory cell to the capacitance of the digit line. Increasing the beta ratio is accomplished by transitioning the isolation transistors 120 or 121 to off during the sensing operation. In the example read of memory cell $103_1$, isolation transistors 121 would be in the off state during the sensing operation to isolate the bottom half of the digit line pair from N-sense amplifier 111.

By isolating one half of the digit line pair, the effective capacitance of the digit line pair is halved. Accordingly, when the charge of storage capacitor $107_1$ of memory cell $103_1$ is shared only with the top half of digit line 109, the beta ratio is increased, and the cell margin is higher than it would have been had all of digit line 109 shared the charge.

Upon sensing the data of memory cell $103_1$, isolation transistors 120 and 121 are placed in the on state and column select 113 couples digit line 109 and digit complement line 110 to I/O line 114 and I/O complement line 115. Coupling the digit line pair to the I/O line pair thus permits reading the data stored in the memory cell across the I/O line pair.

The reliability of the sensing operation of memory device 100 can be tested by altering the capacitance of one or both digit lines. The various embodiments of the invention alter the capacitance of digit lines by coupling multiple memory cells to the digit line. Each memory cell added to the digit line increases the digit line capacitance by an amount approximately equal to the capacitance of the memory cell's storage capacitor. The various embodiments utilize external control signals and internal circuitry to override the normal timing of latching row addresses, deactivation of the equilibrate transistors and activation of the sense amplifiers.

One example of a memory device testing method includes decreasing, or stressing, the cell margin. U.S. Pat. No. 5,544,108 issued Aug. 6, 1996 to Thomann describes one such method of stressing the cell margin by not isolating the halves of the digit line pair during the sensing operation. In accordance with an embodiment of the invention, cell margin is stressed by incrementally increasing the capacitance of one or both digit lines of the digit line pair through the coupling of multiple memory cells 103 to digit line 109 and/or digit complement line 110 prior to the sensing operation.

In one embodiment of the invention, multiple memory cells are coupled to the digit line pair in succession. As each memory cell is coupled to the digit line pair, the equilibrate transistors 122 are left on and the sense amplifiers 111 and 112 are not fired. Accordingly, the potential of each digit line of the digit line pair is left undisturbed as each memory cell is coupled to its respective digit line. The number and order of memory cells coupled to the digit line pair while digit line equilibrate remains activated is a design choice for the user. Each memory cell coupled to a digit line increases that digit line's capacitance. Additionally, the number of memory cells coupled to each digit line of the digit line pair prior to a sensing operation may be unequal to intentionally create an imbalance between the capacitance of a first digit line of the digit line pair and the second digit line of the digit line pair. Performing a sensing operation with increased and/or imbalanced capacitance may foretell memory devices prone to failure during use.

Figure 2:
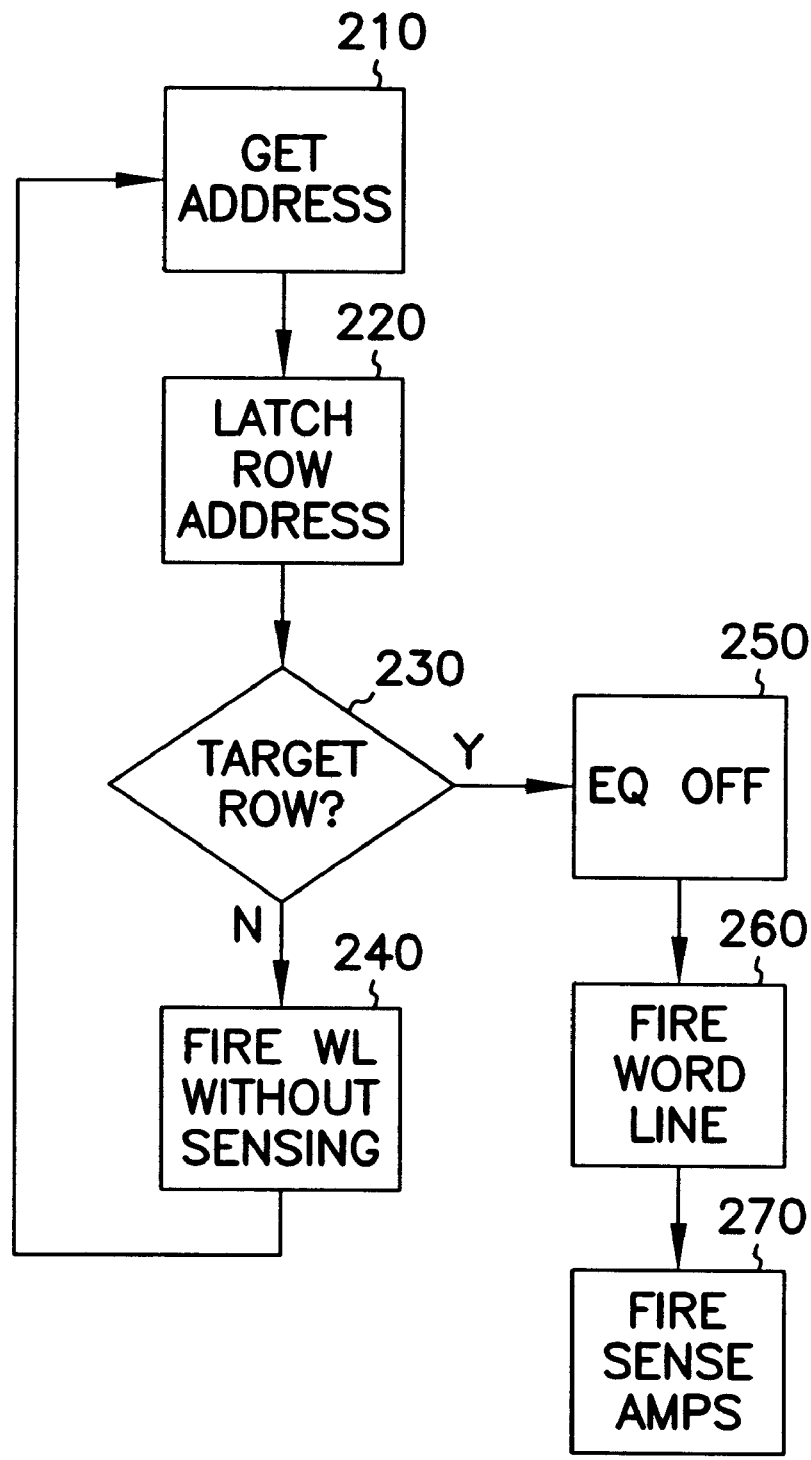
FIG. 2 is a flowchart of a memory device testing method in accordance with one embodiment of the invention.

FIG. 2 is a flow chart of a memory device testing procedure in accordance with one embodiment of the invention. FIG. 2 includes action boxes 210, 220, 240, 250, 260 and 270, and decision box 230. The address of a memory cell is obtained or specified in action box 210. The memory cell address may be entered manually, but would preferably be automated by a testing apparatus. The address may be representative of multiple memory cells across a group of memory subarrays, thus allowing simultaneous testing of multiple subarrays. The row address is latched in action box 220 to allow firing, or activation, of the word line or word lines associated with the address. Decision box 230 determines if the most recent row address represents the target row, i.e., whether it is the row whose data is to be sensed. If not, control is transferred to action box 240 which activates the word line driver and fires the word line associated with the row address while digit line equilibrate is activated and the sense amplifiers are deactivated. This action couples each memory cell associated with the word line to its respective digit line. This is termed a sacrificial read, as the data bit of the addressed memory cell is lost upon sharing charge with a digit line under digit line equilibrate, and the row associated with the addressed memory cell is termed a sacrificial row. Because the row address remains latched, each memory cell will remain coupled to its respective digit line during subsequent word line activations. Control is then returned to action box 210 to proceed with the next address.

If the last address represents the target row in decision box 230, control is transferred to action box 250 where digit line equilibrate is deactivated. Each memory cell previously coupled to a digit line remains coupled to the digit line. The target word line is fired in action box 260 and the sense amplifiers are fired in action box 270. The sensing operation is thus performed under conditions of increased and/or imbalanced digit line capacitance. Information obtained from the test, such as success/failure or speed of the sensing operation, can be used to predict reliability of the memory device under normal use conditions. Such testing may further be utilized by designers of memory devices. By repeating the testing on the same target row, but varying the number of memory cells coupled to the digit line, and thus the level and/or imbalance of the capacitance of the digit line, designers can determine the sensitivity of the sense amplifiers which may be used to optimize timing and other parameters of the memory device.

An example of an embodiment having a balanced capacitance can be described with reference to FIGS. 1 and 2. The target row in this example is $WL_5$. A first memory cell address is specified by the user or testing apparatus in action box 210. In this example, the first memory cell address is for memory cell $103_1$. The row address $WL_1$ is latched to allow firing of word line driver $140_1$. $WL_1$ is not the target row in decision box 230, so control is transferred to action box 240. In action box 240, word line driver $140_1$ is fired to activate access transistor $108_1$ and couple memory cell $103_1$ to digit line 109. Equilibrate transistors 122 are on and the N-sense amplifier 111 and the P-sense amplifier 112 are off, so storage capacitor $107_1$ takes on the potential of the equilibrated digit line pair.

A second memory cell address is then specified by the user or testing apparatus in action box 210. In this example, the second memory cell address is for memory cell $103_2$. The row address $WL_2$ is latched to allow firing of word line driver $140_2$. $WL_2$ is not the target row in decision box 230, so control is transferred to action box 240. In action box 240, word line driver $140_2$ is fired to activate access transistor $108_2$ and couple memory cell $103_2$ to digit complement line 110. Equilibrate transistors 122 are on and the N-sense amplifier 111 and the P-sense amplifier 112 are off, so storage capacitor $107_2$ takes on the potential of the equilibrated digit line pair. Because the row address $WL_1$ remains latched, memory cell $103_1$ is coupled to digit line 109 concurrently with the coupling of memory cell $103_2$ to digit complement line 110.

Additional memory cells could be coupled to the digit line pair in like fashion. Each additional address is similarly latched to permit successive addition of capacitance to the digit lines. There is no limit inherent in the procedure to the number of memory cells that can be simultaneously coupled to the digit line pair. In this balanced example, however, the number of memory cells coupled to digit line 109 is equal to the number of memory cells coupled to digit complement line 110 prior to specifying the target address.

The memory cell address of the target row $WL_5$ is then specified in action box 210, i.e., the address of memory cell $103_5$. As before, the row address is latched to allow firing of word line driver $140_5$. $WL_5$ is the target row in decision box 230, so control is transferred to action box 250. In action box 250, the equilibrate transistors 122 are turned off to allow digit line 109 and digit complement line 110 to float. Isolation transistors 121 are turned off to isolate the bottom half of the digit line pair from the N-sense amplifier 111. In action box 260, word line driver $140_5$ is fired to activate access transistor $108_5$ and couple memory cell $103_5$ to digit line 109. Storage capacitor $107_5$ thus shares its charge with digit line 109. The N-sense amplifier 111 is fired to begin the sensing operation in action box 270. The sensing operation continues with the N-sense amplifier 111 sensing the differential of potentials between digit line 109 and digit complement line 110. If successful, N-sense amplifier 111 pulls the appropriate digit line of the digit line pair to ground followed by activation of P-sense amplifier 112 and its associated pull-up of the remaining digit line.

An example of an embodiment having an imbalanced capacitance can also be described with reference to FIGS. 1 and 2. The target row in this example is again $WL_5$. A first memory cell address is specified by the user or testing apparatus in action box 210. In this example, the first memory cell address is for memory cell $103_1$. The row address $WL_1$ is latched to allow firing of word line driver $140_1$. $WL_1$ is not the target row in decision box 230, so control is transferred to action box 240. In action box 240, word line driver $140_1$ is fired to activate access transistor $108_1$ and couple memory cell $103_1$ to digit line 109. Equilibrate transistors 122 are on and the N-sense amplifier 111 and the P-sense amplifier 112 are off, so storage capacitor $107_1$ takes on the potential of the equilibrated digit line pair.

A second memory cell address is then specified by the user or testing apparatus in action box 210. In this example, the second memory cell address is for memory cell $103_3$. The row address $WL_3$ is latched to allow firing of word line driver $140_3$. $WL_3$ is not the target row in decision box 230, so control is transferred to action box 240. In action box 240, word line driver $140_3$ is fired to activate access transistor $108_3$ and couple memory cell $103_3$ to digit line 109. Equilibrate transistors 122 are on and the N-sense amplifier 111 and the P-sense amplifier 112 are off, so storage capacitor $107_3$ takes on the potential of the equilibrated digit line pair. Because the row address $WL_1$ remains latched, memory cell $103_1$ is coupled to digit line 109 concurrently with the coupling of memory cell $103_3$ to digit line 109.

Additional memory cells could be coupled to the digit lines in like fashion. Each additional address is similarly latched to permit successive addition of capacitance to the digit lines. There is no limit inherent in the procedure to the number of memory cells that can be simultaneously coupled to the digit line pair. In this imbalanced example, however, the number of memory cells coupled to digit line 109 is different from the number of memory cells coupled to digit complement line 110 prior to specifying the target address. While there are no memory cells coupled to digit complement line 110 in this example, there is no such limitation. Furthermore, the target row need not be coupled to the digit line having the largest capacitance.

The memory cell address of the target row $WL_5$ is then specified in action box 210, i.e., the address of memory cell $103_5$. As before, the row address is latched to allow firing of word line driver $140_5$. $WL_5$ is the target row in decision box 230, so control is transferred to action box 250. In action box 250, the equilibrate transistors 122 are turned off to allow digit line 109 and digit complement line 110 to float. Isolation transistors 121 are turned off to isolate the bottom half of the digit line pair from the N-sense amplifier 111. In action box 260, word line driver $140_5$ is fired to activate access transistor $108_5$ and couple memory cell $103_5$ to digit line 109. Storage capacitor $107_5$ thus shares its charge with digit line 109. The N-sense amplifier 111 is fired to begin the sensing operation in action box 270. The sensing operation continues with the N-sense amplifier 111 sensing the differential of potentials between digit line 109 and digit complement line 110. If successful, N-sense amplifier 111 pulls the appropriate digit line of the digit line pair to ground followed by activation of P-sense amplifier 112 and its associated pull-up of the remaining digit line.

In embodiments utilizing either balanced or imbalanced capacitance, there is no limitation that the sacrificial row be serial, e.g., $WL_1$ and $WL_3$, separated, e.g., $WL_1$ and $WL_5$, adjacent, e.g., $WL_1$ and $WL_2$, nor consecutive, e.g., $WL_1$/ $WL_2$/$WL_3$, with another sacrificial row or the target row. Any combination is permissible. In addition, there is no limitation that the sacrificial rows and/or the target row be located on the same half of the digit line. It should be apparent that if latched row addresses span both halves of the digit line, the isolation transistors, as in Thomann, must remain on during the sensing operation. Furthermore, the sacrificial rows and target row may span across more than one local phase within a subarray.

The various embodiments of the invention can utilize any method of latching multiple word lines. One example would be to use static dedicated word line latches. An alternative would be to use what has been termed sticky row mode. Sticky row mode is more fully described in U.S. patent application Ser. No. 09/145,865 filed Sep. 2, 1998 and titled *Method and Apparatus for Multiple Row Activation & Memory Devices* which is commonly assigned and incorporated herein by reference. An example of sticky row mode can be described with reference to FIG. 3.

Figure 3:
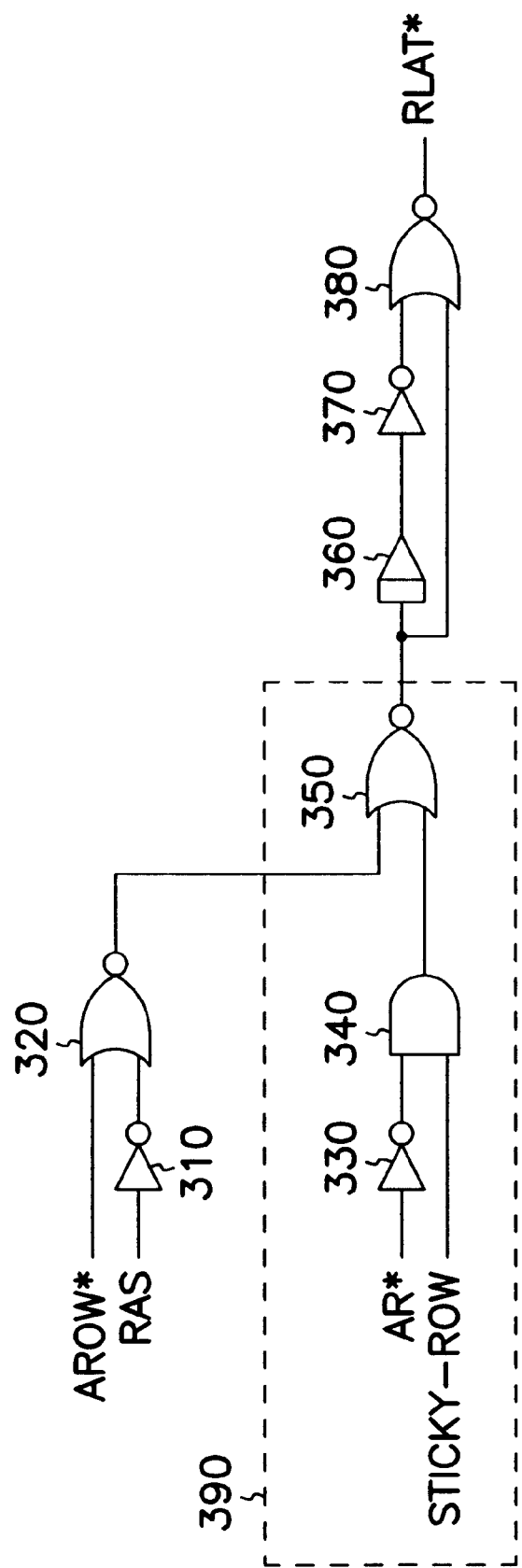
FIG. 3 is a logic diagram of one embodiment of facilitating circuitry for latching multiple row addresses for an embodiment of the invention.

FIG. 3 is a logic diagram to generate a row latch control signal, RLAT*, in accordance with an embodiment of the invention using an external signal, STICKY_ROW. The STICKY_ROW signal may represent a single external signal or a signal generated internally to the memory device from a combination of two or more external signals. The STICKY_ROW signal indicates whether latching of multiple row addresses is enabled, in this case logic 1, or disabled, in this case logic 0.

In normal operation, the STICKY_ROW signal is logic 0 such that RLAT* is responsive to only the row address signal AROW* and a control signal RAS indicative of a desire to fire the word line. The RAS signal is inverted by inverter 310 and input to NOR gate 320 with AROW*. With STICKY_ROW logic 0, the output of AND gate 340 is forced to logic 0, thus allowing AROW* and RAS to determine the output of NOR gate 350. The output of NOR gate 350 is split and input to NOR gate 380 unchanged as well as delayed and inverted by delay 360 and inverter 370.

It will be seen that the output of NOR gate 380, i.e., RLAT*, will remain at logic 0 except momentarily upon the transition of the output of NOR gate 350 from logic 1 to logic 0. In this situation, due to delay 360, both inputs to NOR gate 380 will be logic 0 for approximately the period of the delay. For this period of delay, the output of NOR gate 380 will transition to a logic 1 and release, or unlatch, the row address.

Under a test mode of an embodiment of the invention, the STICKY_ROW signal is logic 1, indicating that latching of multiple row addresses is enabled. In addition, control signal AR* is set to logic 0, indicating that a row address is latched. Control signal AR* may be used to block multiple rows from latching when such latching is not desired. Control signal AR* is inverted by inverter 330 and input to AND gate 340 with control signal STICKY_ROW. With AR* at logic 0 and STICKY_ROW at logic 1, the output of AND gate 340 is logic 1. Receiving a logic 1 from AND gate 340, NOR gate 350 is forced to an output of logic 0, thus maintaining RLAT* at logic 0 as multiple word lines are activated. Control signal AR* would be logic 0 during the process described with reference to FIG. 2, and would transition to logic 1 upon sensing the target row, thus deactivating multiple row latching and allowing RLAT* to transition to a logic 1 momentarily to unlatch the word line addresses.

The combination of the AR* signal input, the STICKY_ROW signal input, inverter 330, AND gate 340 and NOR gate 350 form row address latch override circuit 390. While row address latch override circuit 390 may take a variety of forms, its general purpose is to permit external control over release of the row address latching, thus facilitating sequential latching of multiple row addresses.

As an alternative to the foregoing embodiment, the STICKY_ROW signal may be used to both enable and activate latching of multiple row addresses. This can be accomplished by eliminating AND gate 340 and applying the STICKY_ROW signal directly to the input of NOR gate 350. Other variations of control signal combinations and logic diagrams to achieve the same result will be apparent to those skilled in the art.

Figure 4:
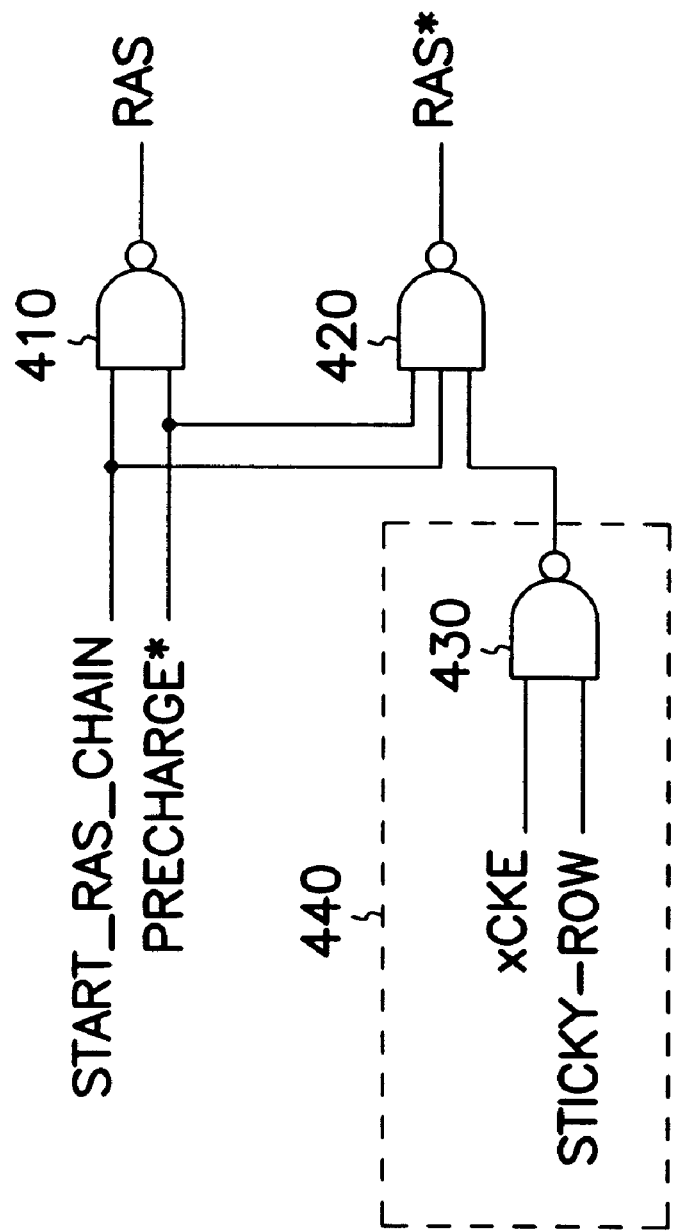
FIG. 4 is a logic diagram of one embodiment of facilitating circuitry for externally controlling digit line equilibrate and sensing for an embodiment of the invention.

In addition to providing for latching of multiple row addresses, the various embodiments of the invention further allow firing of word lines with digit line equilibrate on, or activated, and the sense amplifiers off, or deactivated. FIG. 4 is a logic diagram, in accordance with an embodiment of the invention, using a combination of external signals to allow activation of word line drivers while maintaining external control over deactivation of digit line equilibrate and activation of the sense amplifiers.

With reference to FIG. 4, the control signal START_RAS_CHAIN represents an internally generated signal to indicate a desire to start the RAS chain upon transition to logic 1. PRECHARGE* is normally logic 0 to disable row addressing, transitioning to logic 1 to enable addressing. The START_RAS_CHAIN and PRECHARGE* signals are each individually input to NAND gate 410, to generate the RAS signal, and NAND gate 420, to generate the RAS* signal. RAS* represents a control signal to initiate deactivation of digit line equilibrate and activation of the sense amplifiers for the sensing operation upon a transition to logic 0. RAS represents a control signal to initiate activation of the word line driver to fire the addressed word lines upon a transition to logic 0. Delays are commonly utilized to control the timing of the generation of the RAS signal relative to the generation of the RAS* signal to initiate the proper sequence of events in the RAS chain. Such delays are well understood in the art.

The control signal xCKE is an external clock enable signal, but is a convenient choice to provide external control of deactivating digit line equilibrate and activating the sense amplifiers. The xCKE signal is input to NAND gate 430 with the STICKY_ROW signal. In normal operation, STICKY_ROW is logic 0, such that the output of NAND gate 430 is forced to a logic 1 regardless of the logic value of xCKE. This facilitates normal sequencing of the RAS chain by permitting START_RAS_CHAIN and PRECHARGE* to wholly control the output of NAND gate 420. With STICKY_ROW set at logic 1 to enable latching of multiple row addresses, the logic value of xCKE controls the output of NAND gate 430.

The combination of the xCKE signal input, the STICKY_ROW signal input and NAND gate 430 form sense amplifier strobe override circuit 440. While sense amplifier strobe override circuit 440 may take a variety of forms, its general purpose is to permit external control over digit line equilibrate and sensing operations without inhibiting activation of word line drivers.

It is understood that with digit line equilibrate and sense amplifier firing self-timed from the same control signal, i.e., xCKE, digit line equilibrate will be timed to occur first with a sufficiently large timing window relative to the sense amplifier firing to permit firing of the word line.

During testing modes with STICKY_ROW set at logic 1, RAS* will be forced to logic 1 as long as xCKE is logic 1, as the output of NAND gate 430 will be logic 0 in this case. Accordingly, while the RAS signal will transition to logic 0 to initiate activation of the word line driver to fire the addressed word line or lines, RAS* remains at logic 1 such that digit line equilibrate remains activated and the sense amplifiers remain deactivated. Upon reaching the target row address, xCKE is transitioned to logic 0 to again permit START_RAS_CHAIN and PRECHARGE* to control the output of NAND gate 420 and permit deactivation of digit line equilibrate and activation of the sense amplifiers. Other variations of control signal combinations and logic diagrams to achieve the same result will be apparent to those skilled in the art.

The testing methods of various embodiments of the invention may be performed prior to row repair, or with row repair disabled. As a consequence, however, it should be noted that some of the sacrificial rows may be defective and propagate errors to non-defective rows. For example, a shorted memory cell on a sacrificed row can degrade proper digit line equilibrate on its given column and incorrectly fail the sensing operation of that column with the target row. This problem can be avoided in one embodiment by modifying the method depicted in FIG. 2 as shown in FIG. 5.

Figure 5:
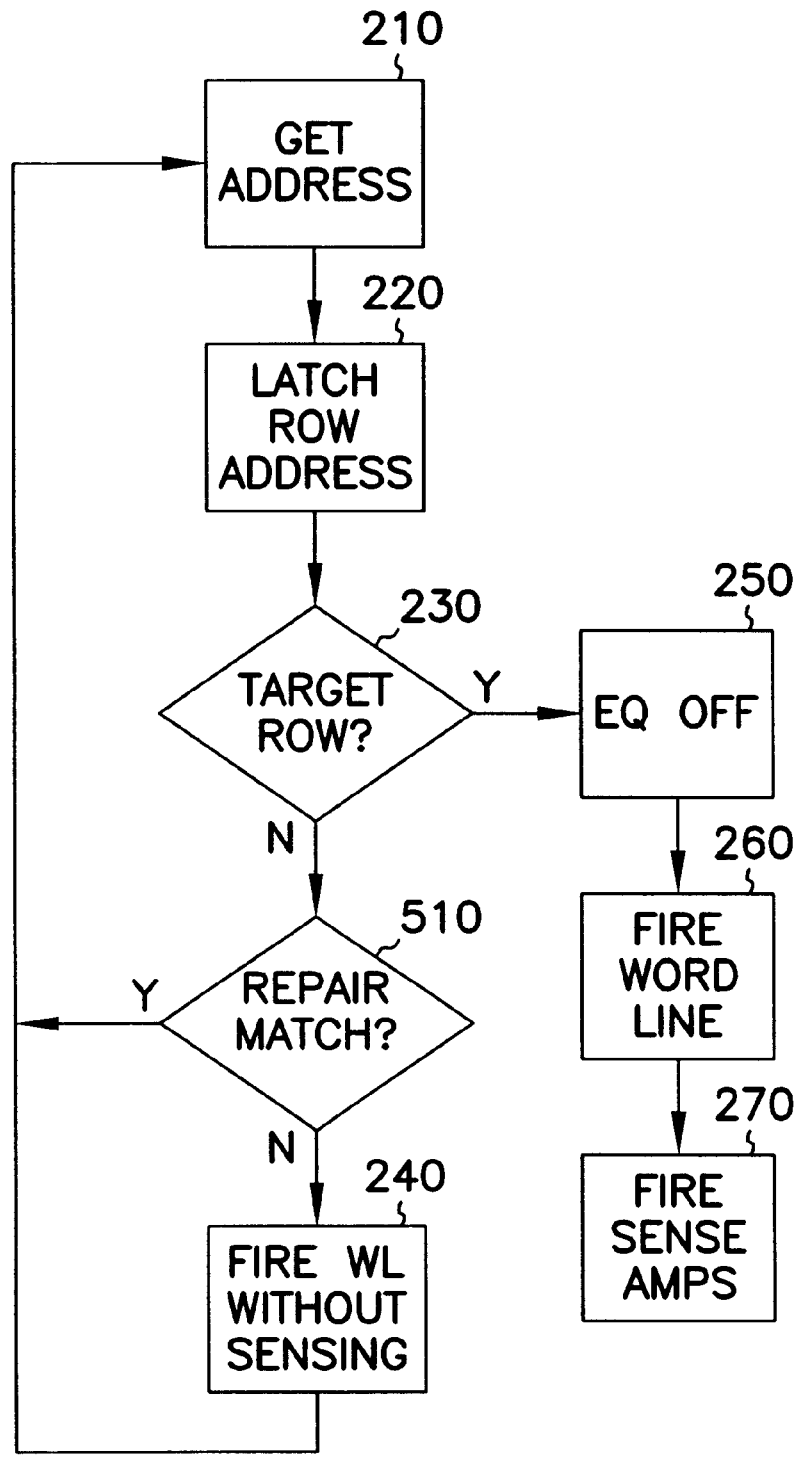
FIG. 5 is a flowchart of a memory device testing method in accordance with one embodiment of the invention.

FIG. 5 is a flow chart of one embodiment of the invention utilizing a repair match signal to mask the sacrificial row from activating its associated word line driver and thus disable it from coupling to its associated digit line. The repair match signal is generated post repair to indicate that a supplied memory cell address has been repaired out and to route addressing to a redundant cell or row. FIG. 5 demonstrates how the use of the repair match signal can be used to bypass activation of the defective cell. FIG. 5 differs from FIG. 2 in the addition of decision box 510. If a repair match signal is generated in response to a sacrificial row address at decision box 510, control is transferred back to action box 210 without firing the word line in action box 250.

Alternatively, the device can utilize a cloak repair mode to avoid indication of erroneous failures. The cloak repair mode is more fully described in U.S. patent application Ser. No. 09/103,763 filed Jun. 24, 1998 and titled *Circuit & Method for Masking a Dormant Memory Cell* which is commonly assigned and incorporated herein by reference. Cloak repair mode provides a method for the testing apparatus to prewrite expected data to the device, thus cloaking potentially bogus data. With cloak repair mode enabled, the memory device under test prewrites expected data to the sense amplifiers if an addressed row is repaired out, thus masking out potential error propagation post row repair. Expected data may be prewritten, for example, by providing expected data, i.e., an expected potential, to the digit lines prior to activating the sense amplifiers. In one embodiment, cloak repair mode is enabled only when the target row is repaired out. In another embodiment, cloak repair mode is enabled when at least one of the sacrificial rows or the target row is repaired out. In any embodiment enabling cloak repair mode, it is preferred that multiple sacrificial/target row combinations be tested to improve the odds that every non-repaired target row is stressed with non-repaired sacrificial rows.

Due to the complexity and size of many dynamic memory devices, addressing is often divided into global phases and local phases. The rows of a subarray may be grouped into local phases, facilitating access to a specific group of rows in the subarray. Local phases from multiple subarrays may further be grouped into global phases, facilitating access to a specific group of local phases in the array. Global phase drivers enable the groupings of local phases. Local phase drivers, in turn, enable the groupings of rows in the subarrays. Word line drivers enable individual rows.

Figure 6:
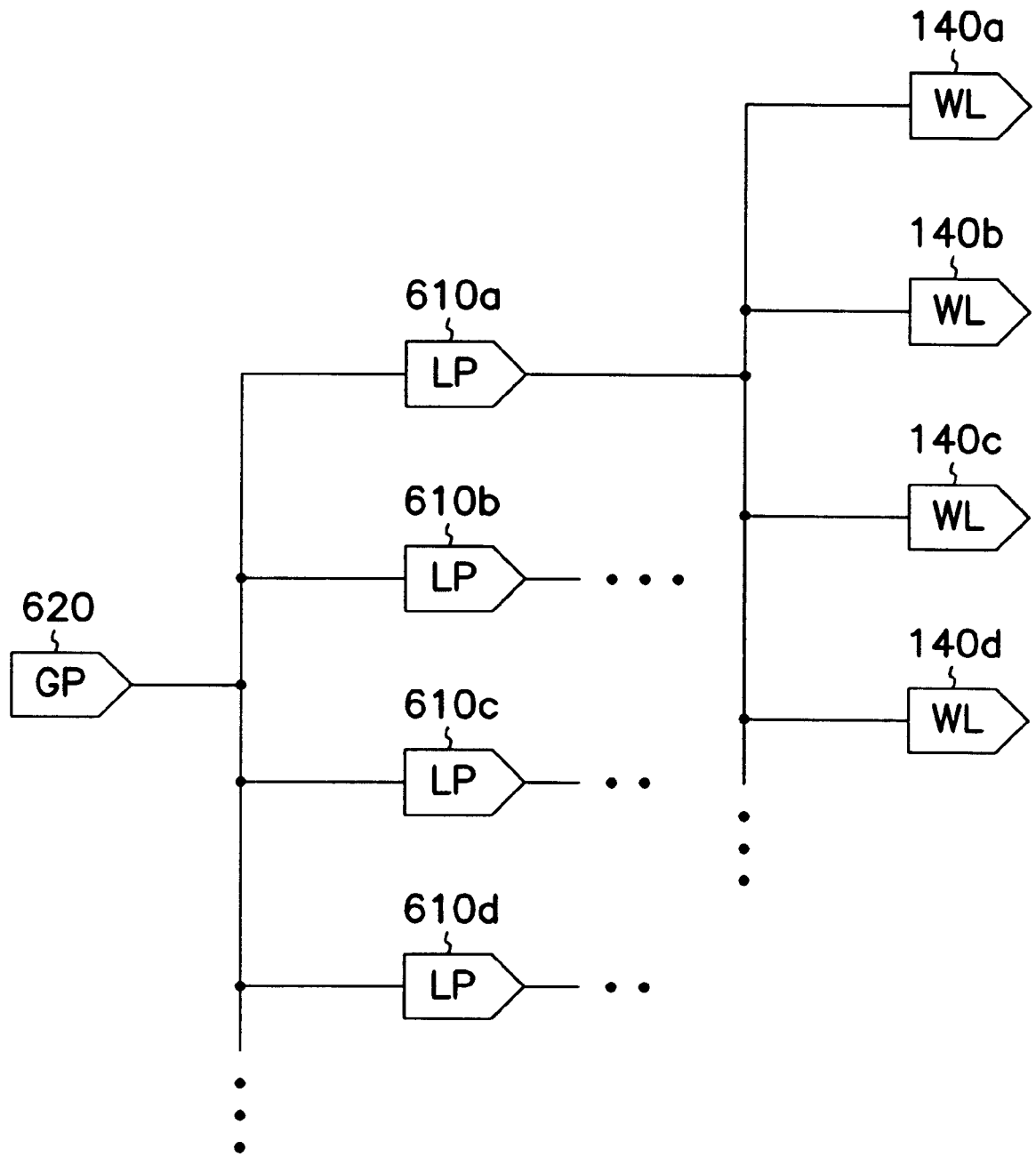
FIG. 6 is an addressing scenario for use with an embodiment of the invention.

One example of this addressing scenario is depicted in FIG. 6. FIG. 6 shows a global phase driver 620 enabling a plurality of local phase drivers 610. Local phase driver 610*a* is further shown to enable a plurality of word line drivers 140. Such addressing scenarios permit simultaneous testing of multiple subarrays in accordance with the invention, where enabling global phase driver 620 enables a local phase driver 610 for each of a plurality of subarrays.

It will be understood that the above description of Dynamic Random Access Memory (DRAM) is not a complete description of all the elements and features of a DRAM. Further, the invention is equally applicable to any size and type of memory circuit and is not intended to be limited to the DRAM described above. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dies as is well known in the art.

Semiconductor Dies

Figure 7:
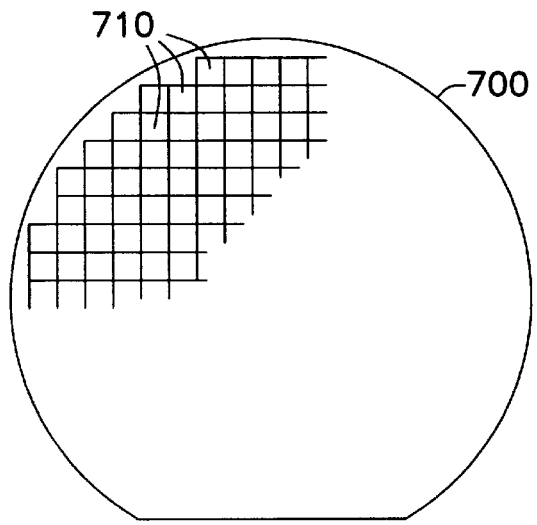
FIG. 7 is an elevation view of a wafer containing semiconductor dies in accordance with an embodiment of the invention.

With reference to FIG. 7, in one embodiment, a semiconductor die 710 is produced from a silicon wafer 700. A die is an individual pattern, typically rectangular, on a substrate that contains circuitry, or integrated circuit devices, to perform a specific function. The integrated circuit devices of the die 700 contain at least one memory device adapted to facilitate the testing methods of the invention. A semiconductor wafer will typically contain a repeated pattern of such dies containing the same functionality. Die 710 may further contain additional circuitry to extend to such complex devices as a monolithic processor with multiple functionality. Die 710 is typically packaged in a protective casing (not shown) with leads extending therefrom (not shown) providing access to the circuitry of the die for unilateral or bilateral communication and control.

Circuit Modules

Figure 8:
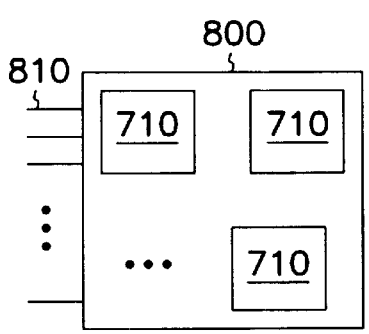
FIG. 8 is a block diagram of an exemplary circuit module in accordance with an embodiment of the invention.

As shown in FIG. 8, two or more dies 710 may be combined, with or without protective casing, into a circuit module 800 to enhance or extend the functionality of an individual die 710. Circuit module 800 may be a combination of dies 710 representing a variety of functions, or a combination of dies 710 containing the same functionality. Some examples of a circuit module include memory modules, device drivers, power modules, communication modems, processor modules and application-specific modules and may include multilayer, multichip modules. Circuit module 800 may be a subcomponent of a variety of electronic systems, such as a clock, a television, a cell phone, a personal computer, an automobile, an industrial control system, an aircraft and others. Circuit module 800 will have a variety of leads 810 extending therefrom and coupled to the dies 710 providing unilateral or bilateral communication and control.

Figure 9:
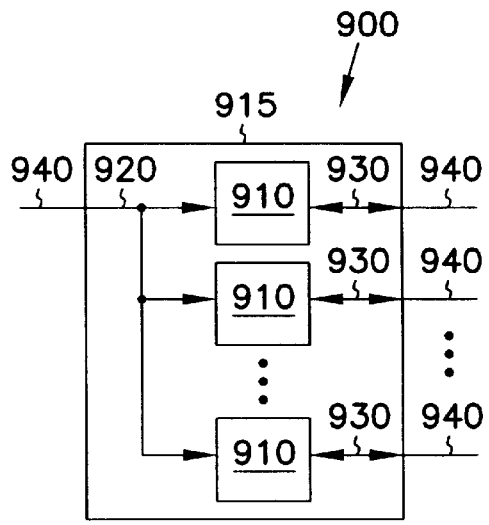
FIG. 9 is a block diagram of an exemplary memory module in accordance with an embodiment of the invention.

FIG. 9 shows one embodiment of a circuit module as memory module 900. Memory module 900 generally depicts a Single Inline Memory Module (SIMM) or Dual Inline Memory Module (DIMM). A SIMM or DIMM is generally a printed circuit board (PCB) or other support containing a series of memory devices. While a SIMM will have a single in-line set of contacts or leads, a DIMM will have a set of leads on each side of the support with each set representing separate I/O signals. Memory module 900 contains multiple memory devices 910 contained on support 915, the number depending upon the desired bus width and the desire for parity. Memory module 900 may contain memory devices 910 on both sides of support 915. Memory module 900 accepts a command signal from an external controller (not shown) on a command link 920 and provides for data input and data output on data links 930. The command link 920 and data links 930 are connected to leads 940 extending from the support 915. Leads 940 are shown for conceptual purposes and are not limited to the positions shown in FIG. 9.

Electronic Systems

Figure 10:
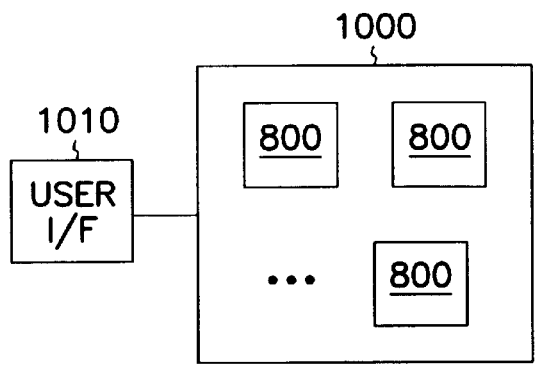
FIG. 10 is a block diagram of an exemplary electronic system in accordance with an embodiment of the invention.

FIG. 10 shows an electronic system 1000 containing one or more circuit modules 800. Electronic system 1000 generally contains a user interface 1010. User interface 1010 provides a user of the electronic system 1000 with some form of control or observation of the results of the electronic system 1000. Some examples of user interface 1010 include the keyboard, pointing device, monitor and printer of a personal computer; the tuning dial, display and speakers of a radio; the ignition switch and gas pedal of an automobile; and the card reader, keypad, display and currency dispenser of an automated teller machine. User interface 1010 may further describe access ports provided to electronic system 1000. Access ports are used to connect an electronic system to the more tangible user interface components previously exemplified. One or more of the circuit modules 800 may be a processor providing some form of manipulation, control or direction of inputs from or outputs to user interface 1010, or of other information either preprogrammed into, or otherwise provided to, electronic system 1000. As will be apparent from the lists of examples previously given, electronic system 1000 will often contain certain mechanical components (not shown) in addition to circuit modules 800 and user interface 1010. It will be appreciated that the one or more circuit modules 800 in electronic system 1000 can be replaced by a single integrated circuit. Furthermore, electronic system 1000 may be a subcomponent of a larger electronic system.

Figure 11:
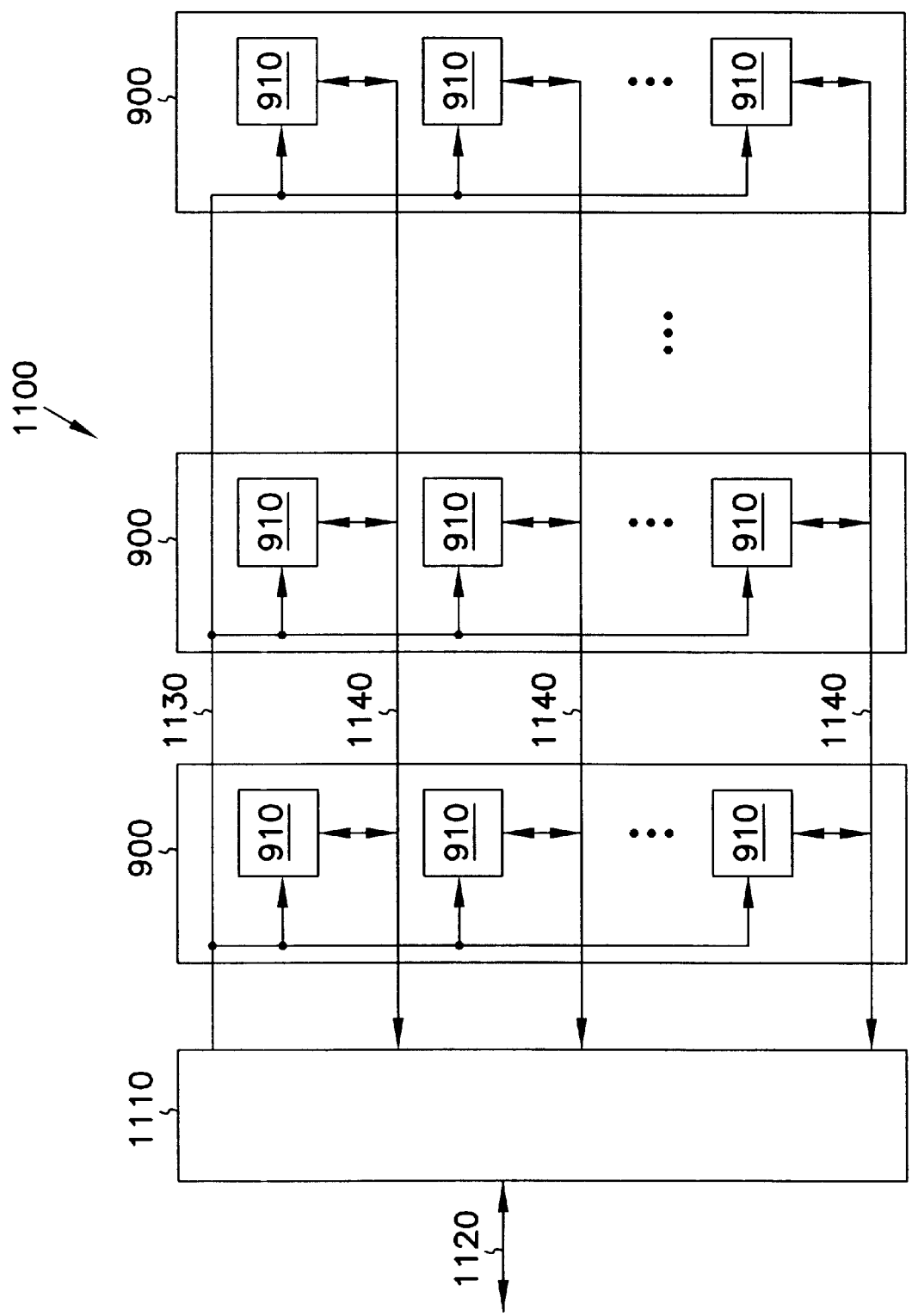
FIG. 11 is a block diagram of an exemplary memory system in accordance with an embodiment of the invention.

FIG. 11 shows one embodiment of an electronic system as memory system 1100. Memory system 1100 contains one or more memory modules 900 and a memory controller 1110. Memory controller 1110 provides and controls a bidirectional interface between memory system 1100 and an external system bus 1120. Memory system 1100 accepts a command signal from the external bus 1120 and relays it to the one or more memory modules 900 on a command link 1130. Memory system 1100 provides for data input and data output between the one or more memory modules 900 and external system bus 1120 on data links 1140.

Figure 12:
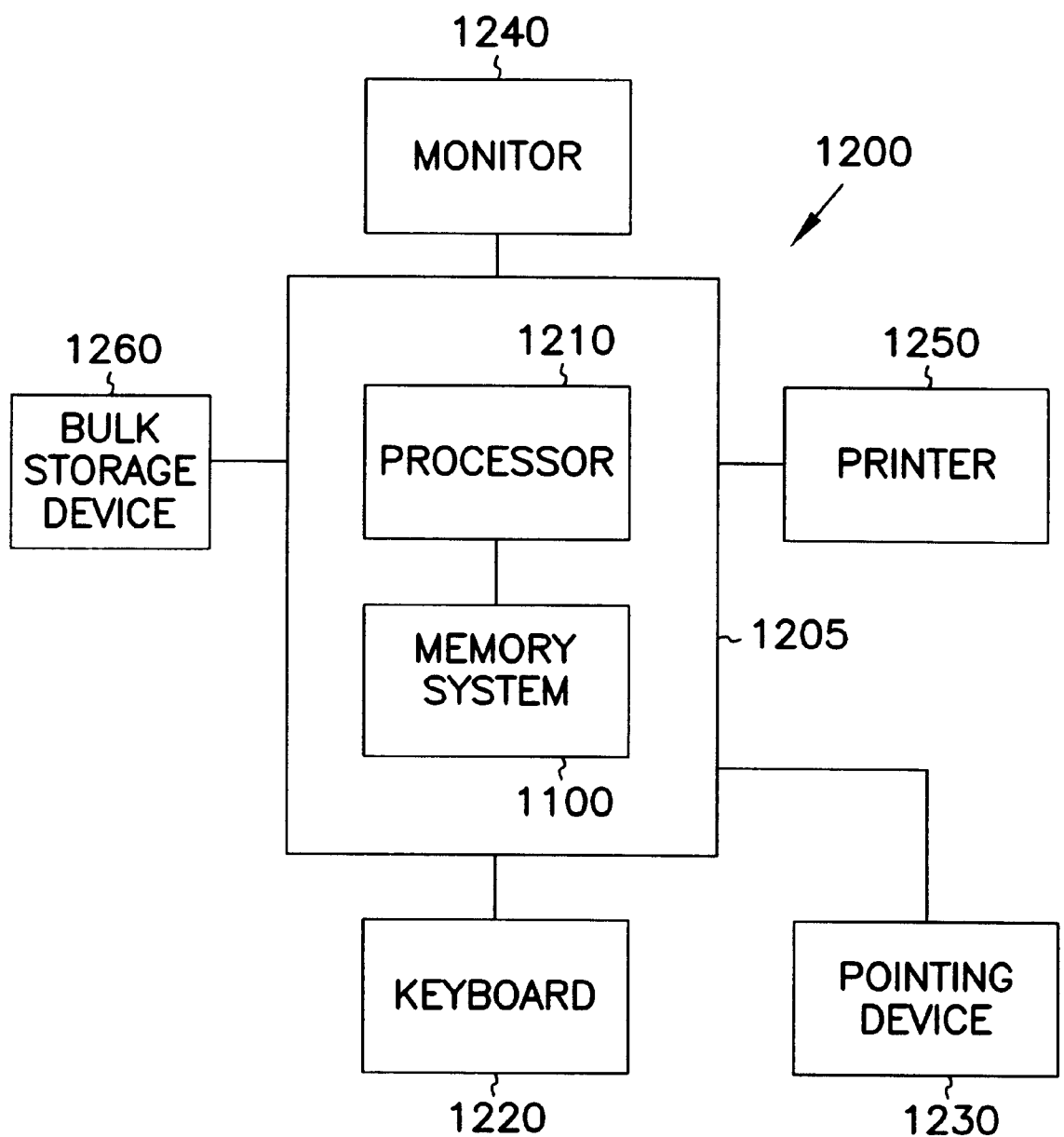
FIG. 12 is a block diagram of an exemplary computer system in accordance with an embodiment of the invention.

FIG. 12 shows a further embodiment of an electronic system as a computer system 1200. Computer system 1200 contains a processor 1210 and a memory system 1100 housed in a computer unit 1205. Computer system 1200 is but one example of an electronic system containing another electronic system, i.e., memory system 1100, as a subcomponent. Computer system 1200 optionally contains user interface components. Depicted in FIG. 12 are a keyboard 1220, a pointing device 1230, a monitor 1240, a printer 1250 and a bulk storage device 1260. It will be appreciated that other components are often associated with computer system 1200 such as modems, device driver cards, additional storage devices, etc. It will further be appreciated that the processor 1210 and memory system 1100 of computer system 1200 can be incorporated on a single integrated circuit. Such single package processing units reduce the communication time between the processor and the memory circuit.

Conclusion

The foregoing has described testing methods and facilitating circuitry to permit activation and latching of multiple word lines in a dynamic memory device in conjunction with external control over digit line equilibrate and activation of sense amplifiers. Such testing methods permit controlled stressing of cell margin and beta ratio by selective coupling of one or more sacrificial rows to a digit line prior to sensing of data in a target row. Useful design and reliability information may be obtained through application of various embodiments of the invention. The foregoing has further described variations for testing memory devices either prior to or post row repair.

Although specific embodiments have been illustrated and described herein, it will be appreciated by those of ordinary skill in the art that any arrangement which is calculated to achieve the same purpose may be substituted for the specific embodiments shown. Many adaptations of the invention will be apparent to those of ordinary skill in the art. For example, a memory device may utilize an open digit line architecture instead of the more common folded digit line architecture depicted in FIG. 1. Furthermore, memory devices in accordance with the invention may be of any size, including any number of arrays or subarrays. In addition, other external signals or combinations of signals may be utilized in place of the signals described in the example embodiments, and alternative logic diagrams and delay sequences may be incorporated at the designers discretion. Accordingly, this application is intended to cover any adaptations or variations of the invention. It is manifestly intended that this invention be limited only by the following claims and equivalents thereof.

What is claimed is:

1. A method of testing a dynamic memory device, comprising:
coupling at least one first sacrificial memory cell to a first digit line of the memory device with digit line equilibrate activated and sense amplifiers deactivated;
deactivating digit line equilibrate;
coupling a target memory cell to the first digit line subsequent to deactivating digit line equilibrate; and
activating the sense amplifiers subsequent to coupling the target memory cell to the first digit line and while the at least one first sacrificial memory cell remains coupled to the first digit line.

2. The method of claim 1, wherein the first digit line is one digit line of a digit line pair of the memory device.

3. The method of claim 1, wherein the method is performed prior to row repair of the memory device.

4. The method of claim 1, wherein the method is performed after row repair of the memory device and with row repair disabled.

5. The method of claim 1, wherein the method is performed after row repair and a repair match signal disables coupling the at least one first sacrificial memory cell to a first digit line.

6. The method of claim 1, wherein the method is performed after row repair and the memory device prewrites expected data to the sense amplifiers if at least one memory cell selected from the group consisting of the at least one first sacrificial memory cell and the target memory cell are repaired out.

7. The method of claim 1, wherein the method is performed in the order presented.

8. The method of claim 2, further comprising:
coupling at least one second sacrificial memory cell to a second digit line of the digit line pair of the memory device with digit line equilibrate activated and sense amplifiers deactivated; and
activating the sense amplifiers subsequent to coupling the target memory cell to the first digit line and while the at least one first sacrificial memory cell remains coupled to the first digit line and further while the at least one second sacrificial memory cell remains coupled to the second digit line.

9. The method of claim 8, wherein a number of first sacrificial memory cells equals a number of second sacrificial memory cells.

10. The method of claim 8, wherein a number of first sacrificial memory cells is greater than a number of second sacrificial memory cells.

11. The method of claim 8, wherein a number of first sacrificial memory cells is less than a number of second sacrificial memory cells.

12. The method of claim 1, wherein the at least one first sacrificial memory cell and the target memory cell form a group of serial memory cells.

13. The method of claim 8, wherein the at least one first sacrificial memory cell, the at least one second sacrificial memory cell and the target memory cell form a group of consecutive memory cells.

14. A method of testing a dynamic memory device, comprising:
coupling at least one first sacrificial memory cell to a first digit line of a digit line pair of the memory device with digit line equilibrate activated and sense amplifiers deactivated;
coupling at least one second sacrificial memory cell to a second digit line of the digit line pair of the memory device with digit line equilibrate activated and sense amplifiers deactivated;
deactivating digit line equilibrate;
coupling a target memory cell to the first digit line subsequent to deactivating digit line equilibrate; and
activating the sense amplifiers subsequent to coupling the target memory cell to the first digit line and while the at least one first sacrificial memory cell remains coupled to the first digit line and further while the at least one second sacrificial memory cell remains coupled to the second digit line.

15. The method of claim 14, wherein the method is performed in the order presented.

16. A method of testing a dynamic memory device, comprising:
latching a sacrificial row address;

firing a word line associated with the sacrificial row address with digit line equilibrate activated and sense amplifiers deactivated, thereby coupling a sacrificial memory cell to a digit line of the memory device;

deactivating digit line equilibrate without decoupling the sacrificial memory cell from the digit line;

latching a target row address;

firing a word line associated with the target row address with digit line equilibrate deactivated, thereby coupling a target memory cell to the digit line of the memory device; and activating the sense amplifiers with the target memory cell and the sacrificial memory cell coupled to the digit line.

17. The method of claim 16, wherein latching a sacrificial row address and firing a word line associated wit the sacrificial row address is repeated to couple at least two sacrificial memory cells to the digit line.

18. The method of claim 16, wherein the method is performed in the order presented.

19. A method of testing a dynamic memory device, comprising:

latching a first sacrificial row address;

firing a word line associated with the first sacrificial row address with digit line equilibrate activated and sense amplifiers deactivated, thereby coupling a first sacrificial memory cell to a first digit line of a digit line pair of the memory device;

latching a second sacrificial row address;

firing a word line associated with the second sacrificial row address with digit line equilibrate activated and sense amplifiers deactivated, thereby coupling a second sacrificial memory cell to a second digit line of the digit line pair of the memory device;

deactivating digit line equilibrate without decoupling the first or second sacrificial memory cells from the digit line;

latching a target row address;

firing a word line associated with the target row address with digit line equilibrate deactivated, thereby coupling a target memory cell to the first digit line of the memory device; and activating the sense amplifiers with the target memory cell and the first and second sacrificial memory cells coupled to the digit line.

20. The method of claim 19, further comprising coupling at least one additional sacrificial memory cell to at least one digit line selected from the group consisting of the first digit line and the second digit line.

21. The method of claim 20, wherein a capacitance of the digit line pair is of a type selected from the group consisting of balanced and imbalanced.

22. The method of claim 19, wherein the method is performed in the order presented.

23. A dynamic memory device, comprising:

an array of memory cells;

a sense amplifier strobe override circuit in communication with the array of memory cells; and a row address latch override circuit in communication with the array of memory cells;

wherein the dynamic memory device is adapted to carry out a method, the method comprising:

coupling at least one first sacrificial memory cell to a first digit line of the memory device with digit line equilibrate activated and sense amplifiers deactivated;

deactivating digit line equilibrate;

coupling a target memory cell to the first digit line subsequent to deactivating digit line equilibrate; and activating the sense amplifiers subsequent to coupling the target memory cell to the first digit line and while the at least one first sacrificial memory cell remains coupled to the first digit line.

24. A dynamic memory device, comprising:

an array of memory cells;

a sense amplifier strobe override circuit in communication with the array of memory cells; and a row address latch override circuit in communication with the array of memory cells;

wherein the dynamic memory device is adapted to carry out a method, the method comprising:

coupling at least one first sacrificial memory cell to a first digit line of a digit line pair of the memory device with digit line equilibrate activated and sense amplifiers deactivated;

coupling at least one second sacrificial memory cell to a second digit line of the digit line pair of the memory device with digit line equilibrate activated and sense amplifiers deactivated;

deactivating digit line equilibrate;

coupling a target memory cell to the first digit line subsequent to deactivating digit line equilibrate; and activating the sense amplifiers subsequent to coupling the target memory cell to the first digit line and while the at least one first sacrificial memory cell remains coupled to the first digit line and further while the at least one second sacrificial memory cell remains coupled to the second digit line.

25. A dynamic memory device, comprising:

an array of memory cells;

a sense amplifier strobe override circuit in communication with the array of memory cells; and a row address latch override circuit in communication with the array of memory cells;

wherein the dynamic memory device is adapted to carry out a method, the method comprising:

latching a sacrificial row address;

firing a word line associated with the sacrificial row address with digit line equilibrate activated and sense amplifiers deactivated, thereby coupling a sacrificial memory cell to a digit line of the memory device;

deactivating digit line equilibrate without decoupling the sacrificial memory cell from the digit line;

latching a target row address;

firing a word line associated with the target row address with digit line equilibrate deactivated, thereby coupling a target memory cell to the digit line of the memory device; and activating the sense amplifiers with the target memory cell and the sacrificial memory cell coupled to the digit line.

26. A dynamic memory device, comprising:

an array of memory cells;

a sense amplifier strobe override circuit in communication with the array of memory cells; and a row address latch override circuit in communication with the array of memory cells;

wherein the dynamic memory device is adapted to carry out a method, the method comprising:

latching a first sacrificial row address;

firing a word line associated with the first sacrificial row address with digit line equilibrate activated and sense amplifiers deactivated, thereby coupling a first sacrificial memory cell to a first digit line of a digit line pair of the memory device;

latching a second sacrificial row address;

firing a word line associated with the second sacrificial row address with digit line equilibrate activated and sense amplifiers deactivated, thereby coupling a second sacrificial memory cell to a second digit line of the digit line pair of the memory device;

deactivating digit line equilibrate without decoupling the first or second sacrificial memory cells from the digit line;

latching a target row address;

firing a word line associated with the target row address with digit line equilibrate deactivated, thereby coupling a target memory cell to the first digit line of the memory device; and activating the sense amplifiers with the target memory cell and the first and second sacrificial memory cells coupled to the digit line.

27. An electronic system, comprising:

a processor; and a memory device coupled to the processor, wherein the memory device comprises:

an array of memory cells;

a sense amplifier strobe override circuit in communication with the array of memory cells; and a row address latch override circuit in communication with the array of memory cells;

wherein the dynamic memory device is adapted to carry out a method, the method comprising:

coupling at least one first sacrificial memory cell to a first digit line of the memory device with digit line equilibrate activated and sense amplifiers deactivated;

deactivating digit line equilibrate;

coupling a target memory cell to the first digit line subsequent to deactivating digit line equilibrate; and activating the sense amplifiers subsequent to coupling the target memory cell to the first digit line and while the at least one first sacrificial memory cell remains coupled to the first digit line.

28. An electronic system, comprising:

a processor; and a memory device coupled to the processor, wherein the memory device comprises:

an array of memory cells;

a sense amplifier strobe override circuit in communication with the array of memory cells; and a row address latch override circuit in communication with the array of memory cells;

wherein the dynamic memory device is adapted to carry out a method, the method comprising:

coupling at least one first sacrificial memory cell to a first digit line of a digit line pair of the memory device with digit line equilibrate activated and sense amplifiers deactivated;

coupling at least one second sacrificial memory cell to a second digit line of the digit line pair of the memory device with digit line equilibrate activated and sense amplifiers deactivated;

deactivating digit line equilibrate;

coupling a target memory cell to the first digit line subsequent to deactivating digit line equilibrate; and activating the sense amplifiers subsequent to coupling the target memory cell to the first digit line and while the at least one first sacrificial memory cell remains coupled to the first digit line and further while the at least one second sacrificial memory cell remains coupled to the second digit line.

29. An electronic system, comprising:

a processor; and a memory device coupled to the processor, wherein the memory device comprises:

an array of memory cells;

a sense amplifier strobe override circuit in communication with the array of memory cells; and a row address latch override circuit in communication with the array of memory cells;

wherein the dynamic memory device is adapted to carry out a method, the method comprising:

latching a sacrificial row address;

firing a word line associated with the sacrificial row address with digit line equilibrate activated and sense amplifiers deactivated, thereby coupling a sacrificial memory cell to a digit line of the memory device;

deactivating digit line equilibrate without decoupling the sacrificial memory cell from the digit line;

latching a target row address;

firing a word line associated with the target row address with digit line equilibrate deactivated, thereby coupling a target memory cell to the digit line of the memory device; and activating the sense amplifiers with the target memory cell and the sacrificial memory cell coupled to the digit line.

30. An electronic system, comprising:

a processor; and a memory device coupled to the processor, wherein the memory device comprises:

an array of memory cells;

a sense amplifier strobe override circuit in communication with the array of memory cells; and a row address latch override circuit in communication with the array of memory cells;

wherein the dynamic memory device is adapted to carry out a method, the method comprising:

latching a first sacrificial row address;

firing a word line associated with the first sacrificial row address with digit line equilibrate activated and sense amplifiers deactivated, thereby coupling a first sacrificial memory cell to a first digit line of a digit line pair of the memory device;

latching a second sacrificial row address;

firing a word line associated with the second sacrificial row address with digit line equilibrate activated and sense amplifiers deactivated, thereby coupling a second sacrificial memory cell to a second digit line of the digit line pair of the memory device;

deactivating digit line equilibrate without decoupling the first or second sacrificial memory cells from the digit line;

latching a target row address;

firing a word line associated with the target row address with digit line equilibrate deactivated, thereby coupling a target memory cell to the first digit line of the memory device; and activating the sense amplifiers with the target memory cell and the first and second sacrificial memory cells coupled to the digit line.

31. A method of stressing cell margin in a dynamic memory device, comprising:

incrementally adding capacitance to at least one digit line of the memory device, wherein increments have a value approximately equal to a capacitance of a storage capacitor of a memory cell associated with the at least one digit line, thereby generating an increased capacitance of the at least one digit line; and sensing data stored in a target memory cell with the increased capacitance of the at least one digit line.

32. A method of determining sensitivity of a sensing operation in a dynamic memory device, comprising:

sensing data stored in a target memory cell;

incrementally adding capacitance to at least one digit line of the memory device, wherein increments have a value approximately equal to a capacitance of a storage capacitor of a memory cell associated with the at least one digit line, thereby generating an increased capacitance of the at least one digit line;

sensing the data stored in the target memory cell with the increased capacitance of the at least one digit line; and repeating incrementally adding capacitance to the at least one digit line and sensing the data stored in the target memory cell until a level of increased capacitance is reached where the memory device is incapable of sensing the data stored in the target memory cell.

33. A method of testing a dynamic memory device, comprising:

applying a first external signal to inhibit deactivation of digit line equilibrate of a digit line pair of the memory device;

applying a second external signal to inhibit activation of sense amplifiers of the digit line pair of the memory device;

applying a third external signal to permit sequential latching of multiple row addresses of the memory device;

applying at least one sacrificial row address to the memory device for a sacrificial row, thereby coupling a storage capacitor of a sacrificial memory cell to one digit line of the digit line pair for each at least one sacrificial row address while digit line equilibrate is activated and the sense amplifiers are deactivated;

removing the first external signal, thereby allowing deactivation of digit line equilibrate;

removing the second external signal, thereby allowing activation of the sense amplifiers;

deactivating digit line equilibrate;

applying a target row address to the memory device for a target row, thereby coupling a storage capacitor of a target memory cell to one digit line of the digit line pair while digit line equilibrate is deactivated; and activating the sense amplifiers, thereby permitting sensing of a data bit of the storage capacitor of the target memory cell while the storage capacitors of the sacrificial memory cells remain coupled to the digit line pair.

34. The method of claim 33, wherein the first external signal is a signal selected from the group consisting of a single external signal and a combination of at least two external signals.

35. The method of claim 33, wherein the second external signal is a signal selected from the group consisting of a single external signal and a combination of at least two external signals.

36. The method of claim 33, wherein the third external signal is a signal selected from the group consisting of a single external signal and a combination of at least two external signals.

37. The method of claim 33, wherein the first external signal and the second external signal are the same signal.

38. The method of claim 33, wherein the method is performed in the order presented.

39. The method of claim 33, wherein a number of storage capacitors of the sacrificial memory cells coupled to a first digit line of the digit line pair equals a number of storage capacitors of the sacrificial memory cells coupled to a second digit line of the digit line pair.

40. The method of claim 33, wherein a number of storage capacitors of the sacrificial memory cells coupled to a first digit line of the digit line pair exceeds a number of storage capacitors of the sacrificial memory cells coupled to a second digit line of the digit line pair.

41. A method of testing a dynamic memory device post repair, comprising:

coupling at least one first sacrificial memory cell to a first digit line of the memory device with digit line equilibrate activated and sense amplifiers deactivated, wherein the first digit line is one digit line of a digit line pair of the memory device;

coupling at least one second sacrificial memory cell to a second digit line of the digit line pair of the memory device with digit line equilibrate activated and sense amplifiers deactivated;

deactivating digit line equilibrate;

coupling a target memory cell to the first digit line subsequent to deactivating digit line equilibrate;

activating the sense amplifiers subsequent to coupling the target memory cell to the first digit line and while the at least one first sacrificial memory cell remains coupled to the first digit line and further while the at least one second sacrificial memory cell remains coupled to the second digit line; and writing expected data to the sense amplifiers prior to activating the sense amplifiers if at least one memory cell selected from the group consisting of the at least one first sacrificial memory cell, the at least one second sacrificial memory cell and the target memory cell is repaired out.

42. The method of claim 41, wherein the method is performed in the order presented.

43. The method of claim 41, wherein a number of first sacrificial memory cells equals a number of Second sacrificial memory cells.

44. The method of claim 41, wherein a number of first sacrificial memory cells is greater than a number of second sacrificial memory cells.

45. The method of claim 41, wherein a number of first sacrificial memory cells is less than a number of second sacrificial memory cells.

46. The method of claim 41, wherein the at least one first sacrificial memory cell and the target memory cell form a group of serial memory cells.

47. The method of claim 41, wherein the at least one first sacrificial memory cell, the at least one second sacrificial memory cell and the target memory cell form a group of consecutive memory cells.

48. A method of testing a dynamic memory device post repair, comprising:

latching a sacrificial row address;

firing a word line associated with the sacrificial row address with digit line equilibrate activated and sense amplifiers deactivated, thereby coupling a sacrificial memory cell to a digit line of the memory device;

deactivating digit line equilibrate without decoupling the sacrificial memory cell from the digit line;

latching a target row address;

firing a word line associated with the target row address with digit line equilibrate deactivated, thereby coupling a target memory cell to the digit line of the memory device;

activating the sense amplifiers with the target memory cell and the sacrificial memory cell coupled to the digit line; and writing expected data to the sense amplifiers prior to activating the sense amplifiers if at least one memory cell selected from the group consisting of the sacrificial memory cell and the target memory cell is repaired out.

49. The method of claim 48, wherein latching a sacrificial row address and firing a word line associated with the sacrificial row address is repeated to couple at least two sacrificial memory cells to the digit line.

50. The method of claim 48, wherein the method is performed in the order presented.

51. A method of testing a dynamic memory device, comprising:

latching a first sacrificial row address;

firing a word line associated with the first sacrificial row address with digit line equilibrate activated and sense amplifiers deactivated, thereby coupling a first sacrificial memory cell to a first digit line of a digit line pair of the memory device;

latching a second sacrificial row address;

firing a word line associated with the second sacrificial row address with digit line equilibrate activated and sense amplifiers deactivated, thereby coupling a second sacrificial memory cell to a second digit line of the digit line pair of the memory device;

deactivating digit line equilibrate without decoupling the first or second sacrificial memory cells from the digit line;

latching a target row address;

firing a word line associated with the target row address with digit line equilibrate deactivated, thereby coupling a target memory cell to the first digit line of the memory device;

activating the sense amplifiers with the target memory cell and the first and second sacrificial memory cells coupled to the digit line; and writing expected data to the sense amplifiers prior to activating the sense amplifiers if at least one memory cell selected from the group consisting of the first sacrificial memory cell, the second sacrificial memory cell and the target memory cell is repaired out.

52. The method of claim 51, further comprising coupling at least one additional sacrificial memory cell to at least one digit line selected from the group consisting of the first digit line and the second digit line prior to firing the word line associated with the target row address.

53. The method of claim 52, wherein a capacitance of the digit line pair is of a type selected from the group consisting of balanced and imbalanced.

54. The method of claim 51, wherein the method is performed in the order presented.

55. A method of testing a dynamic memory device post repair, comprising:

coupling at least one first sacrificial memory cell to a first digit line of the memory device with digit line equilibrate activated and sense amplifiers deactivated, wherein the first digit line is one digit line of a digit line pair of the memory device;

coupling at least one second sacrificial memory cell to a second digit line of the digit line pair of the memory device with digit line equilibrate activated and sense amplifiers deactivated;

deactivating digit line equilibrate;

coupling a target memory cell to the first digit line subsequent to deactivating digit line equilibrate;

activating the sense amplifiers subsequent to coupling the target memory cell to the first digit line and while the at least one first sacrificial memory cell remains coupled to the first digit line and further while the at least one second sacrificial memory cell remains coupled to the second digit line; and disabling coupling a memory cell selected from the group consisting of the at least one first sacrificial memory cell and the at least one second sacrificial memory cell to its associated digit line in response to a repair match signal, wherein the repair match signal indicates that the memory cell is repaired out.

56. The method of claim 55, wherein the method is performed in the order presented.

57. The method of claim 55, wherein a number of first sacrificial memory cells equals a number of second sacrificial memory cells.

58. The method of claim 55, wherein a number of first sacrificial memory cells is greater than a number of second sacrificial memory cells.

59. The method of claim 55, wherein a number of first sacrificial memory cells is less than a number of second sacrificial memory cells.

60. The method of claim 55, wherein the at least one first sacrificial memory cell and the target memory cell form a group of serial memory cells.

61. The method of claim 55, wherein the at least one first sacrificial memory cell, the at least one second sacrificial memory cell and the target memory cell form a group of consecutive memory cells.

62. A method of testing a dynamic memory device post repair, comprising:

latching a sacrificial row address;

firing a word line associated with the sacrificial row address with digit line equilibrate activated and sense amplifiers deactivated, thereby coupling a sacrificial memory cell to a digit line of the memory device;

deactivating digit line equilibrate without decoupling the sacrificial memory cell from the digit line;

latching a target row address;

firing a word line associated with the target row address with digit line equilibrate deactivated, thereby coupling a target memory cell to the digit line of the memory device;

activating the sense amplifiers with the target memory cell and the sacrificial memory cell coupled to the digit line; and disabling firing the word line associated with the sacrificial row address in response to a repair match signal, wherein the repair match signal indicates that the sacrificial row address is repaired out.

63. The method of claim 62, wherein latching a sacrificial row address and firing a word line associated with the sacrificial row address is repeated to couple at least two sacrificial memory cells to the digit line.

64. The method of claim 62, wherein the method is performed in the order presented.

65. A method of testing a dynamic memory device, comprising:

latching a first sacrificial row address;

firing a word line associated with the first sacrificial row address with digit line equilibrate activated and sense amplifiers deactivated, thereby coupling a first sacrificial memory cell to a first digit line of a digit line pair of the memory device;

latching a second sacrificial row address;

firing a word line associated with the second sacrificial row address with digit line equilibrate activated and sense amplifiers deactivated, thereby coupling a second sacrificial memory cell to a second digit line of the digit line pair of the memory device;

deactivating digit line equilibrate without decoupling the first or second sacrificial memory cells from the digit line;

latching a target row address;

firing a word line associated with the target row address with digit line equilibrate deactivated, thereby coupling a target memory cell to the first digit line of the memory device;

activating the sense amplifiers with the target memory cell and the first and second sacrificial memory cells coupled to the digit line; and disabling firing a word line associated with a row address selected from the group consisting of the first sacrificial row address and the second sacrificial row address in response to a repair match signal, wherein the repair match signal indicates that the row address is repaired out.

66. The method of claim 65, further comprising coupling at least one additional sacrificial memory cell to at least one digit line selected from the group consisting of the first digit line and the second digit line prior to firing the word line associated with the target row address.

67. The method of claim 66, wherein a capacitance of the digit line pair is of a type selected from the group consisting of balanced and imbalanced.

68. The method of claim 65, wherein the method is performed in the order presented.

* * * * *

UNITED STATES PATENT AND TRADEMARK OFFICE
CERTIFICATE OF CORRECTION

PATENT NO.    : 6,104,650
DATED         : August 15, 2000
INVENTOR(S)   : Shore

It is certified that error appears in the above-identified patent and that said Letters Patent is hereby corrected as shown below:

Column 15,
Line 15, delete "wit" and insert --with--, therefor.

Column 17,
Line 49, insert a paragraph break after "and".

Column 20,
line 48, delete "Second" and insert --second--, therefor.

Signed and Sealed this

Tenth Day of July, 2001

*Attest:*

*Nicholas P. Godici*

*Attesting Officer*

NICHOLAS P. GODICI
*Acting Director of the United States Patent and Trademark Office*